United States Patent [19]

Seidler

[11] Patent Number: 5,246,391
[45] Date of Patent: Sep. 21, 1993

[54] SOLDER-BEARING LEAD
[75] Inventor: Jack Seidler, Flushing, N.Y.
[73] Assignee: North American Specialties Corporation, Flushing, N.Y.
[21] Appl. No.: 762,900
[22] Filed: Sep. 19, 1991
[51] Int. Cl.$^5$ ............................................. H01R 4/02
[52] U.S. Cl. ..................................... 439/876; 439/693
[58] Field of Search ..................... 29/883, 884, 885; 439/736, 936, 693, 874–876, 80–83

[56] References Cited

U.S. PATENT DOCUMENTS

| | | | |
|---|---|---|---|
| 4,260,212 | 4/1981 | Ritchie et al. | 29/885 |
| 4,345,814 | 8/1982 | Gutbier et al. | 439/876 |
| 4,780,098 | 10/1988 | Seidler | 439/876 |
| 4,781,602 | 11/1988 | Cobaugh | 439/936 |
| 4,932,876 | 6/1990 | Seidler | 439/876 |
| 5,090,919 | 2/1992 | Tsuji | 439/936 |

Primary Examiner—David L. Pirlot
Attorney, Agent, or Firm—Darby & Darby

[57] ABSTRACT

A solder-bearing lead having a C-clip to resiliently grip the upper and lower surfaces of a substrate. One of the two arms forming the "C" is solder-bearing for mechanical and electrical connection to a conductive area on the substrate. In one embodiment, a polymer plug may be provided on the second arm, the plug having a narrowed neck region for improved retention by the second arm. In another embodiment, the second arm is coated with a non-conductive material, eliminating the need for mechanically retaining a plug or other insulator between the second arm and substrate. The coating on the lead is provided preferably by applying a liquid polymer to the second arm of the lead and hardening the polymer to form a durable, insulating coating.

25 Claims, 3 Drawing Sheets

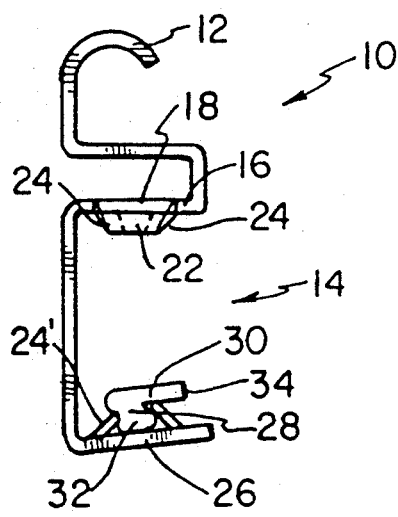
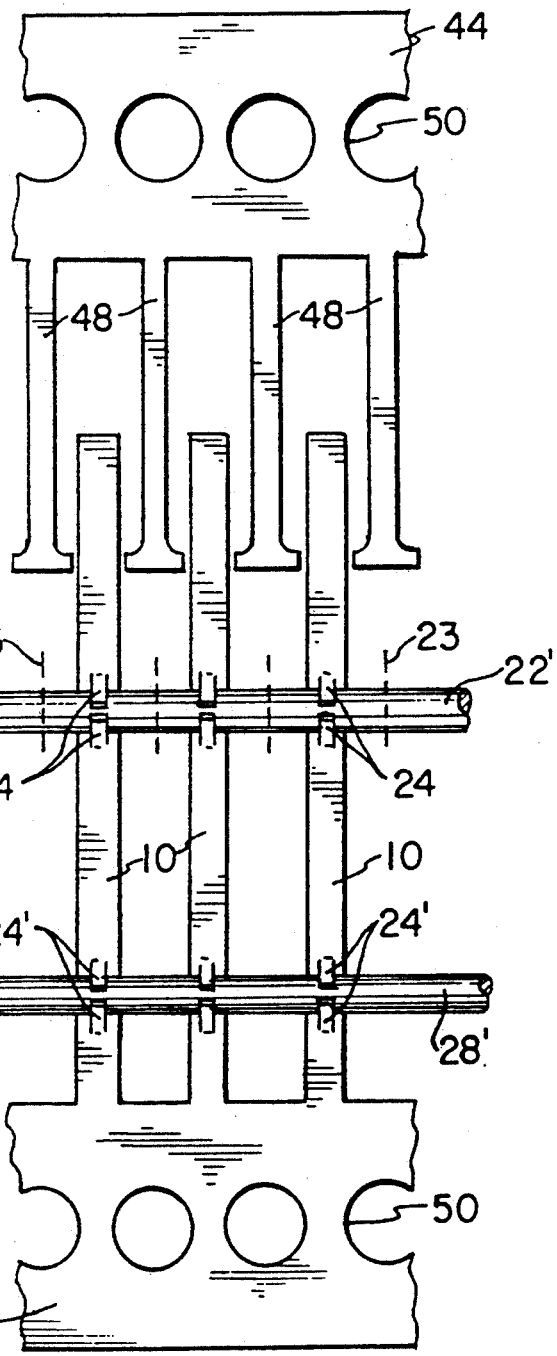

SOLDER-BEARING LEAD

FIELD OF THE INVENTION

This invention relates generally to leads and conductors for connection to substrates. Specifically, the invention relates to a lead (which may be solder-bearing) for connection to a contact surface on an electronic substrate, such as a printed circuit board ("PCB") or an integrated circuit.

BACKGROUND OF THE INVENTION

Terminals, leads, and other conductors for connection to a PCB or an integrated circuit are well known. These connectors are important because PCBs and other electronic substrates in general do not include external leads for connection to associated electronic devices, but include small conductive areas ("pads") on their surfaces. The convenient addition of leads, etc., to the substrate, usually by soldering, is required for efficient and effective use of a substrate.

In recent years, advanced solder-bearing leads have been designed and patented, many by the present inventor, that include a necessary mass of solder at the point of contact with the conductive area of the substrate. After the lead and substrate are juxtaposed, heating the assembly melts the solder, which later cools to form a solid mechanical and electrical bond between the lead and the conductive area. However, since the solder is temporarily liquid, movement of the leads during soldering, which can lead to misconnection or short-circuits, is a serious concern. Custom designs of solder-bearing leads have tackled this problem for different configurations. When conductive areas are present on the upper and lower surface of the substrate, a C-clip is often used that resiliently grips the substrate and holds it in place while the solder is liquid.

The C-clip design has special requirements where electrical contact is desired with the conductive areas of only one surface of the substrate, such as where a substrate includes both upper and lower conductive pads, but only contact with the pads of one surface is desired. Also, a substrate may have only upper conductive pads or lower conductive pads, but it is not desired to have a conductive lead conductively engaging the opposite surface.

There is also a need in the electronic industry for simple and reliable arrangements enabling a manufacturer to test the circuits of substrates to determine whether quality is satisfactory before permanently interconnecting them in more complicated circuits. In many instances during testing of substrates having circuits on more than one surface, it is important to test the circuits on only one surface and insulate them from the other surface.

A variant of the C-clip useful in these situations is disclosed in the present inventor's U.S. Pat. No. 4,780,098. In the lead of this patent, one arm of the C is solder-bearing, while the other arm holds a plastic rod. The rod may extend laterally to adjacent leads, allowing several leads to be held together without a conductive carrier strip. When inserted onto the edge of a substrate, each solder-bearing arm abuts a conductive area on one surface, while the non-conductive rod abuts the opposite surface. In such devices the rod must be secured to the lead, to avoid rotation of the leads with respect to the rod.

OBJECTS OF THE INVENTION

It is an object of the invention to provide a clip-type lead that will electrically contact but one conductive area of a substrate and maintain its position with respect to the substrate during soldering.

It is another object to provide a lead with an improved non-conductive plug for greater stability and durability.

It is yet another object to provide an improved arrangement of a fixedly inter-connected plurality of conductive leads which can be simultaneously assembled to a substrate in a single operation.

It is a further object to provide a solder-bearing clip-type lead that includes an arm that can non-conductively contact a substrate and is easily applied to the substrate.

It is a still further object to provide a clip-type lead for connection to one surface of a substrate, and which is simply, economically, and efficiently manufactured.

SUMMARY OF THE INVENTION

In accordance with the invention, a solder-bearing lead is provided having a C-clip to resiliently grip the upper and lower surfaces of a substrate. One of the two arms forming the "C" is solder-bearing for mechanical and electrical connection to a conductive area on the substrate. In one embodiment, a polymer plug may be provided on the second arm, the plug having a narrowed neck region for improved retention by the second arm. In another embodiment, the second arm is coated with a non-conductive material, eliminating the need for mechanically retaining a plug or other insulator between the second arm and substrate. The coating on the lead is preferably manufactured by applying a liquid polymer to the second arm of the lead and hardening the polymer to form a durable insulating coating.

BRIEF DESCRIPTION OF THE DRAWINGS

The foregoing and other objects and advantages will become apparent to those skilled in the art upon reading the following detailed description in conjunction with the appended drawings, in which:

FIG. 1 is a side view of a lead according to the invention;

FIG. 1A is a plan view of a plurality of leads at an intermediate stage of fabrication;

DETAILED DESCRIPTION OF THE PREFERRED EMBODIMENTS

Figure 2:
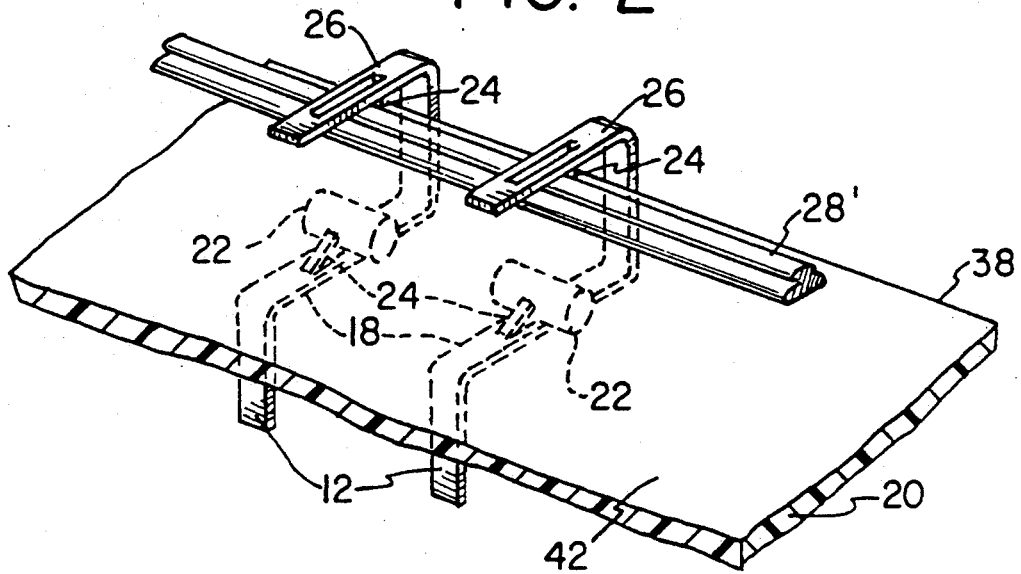
FIG. 2 is a perspective view from the bottom of a number of leads mounted on a substrate.

Referring now to the drawings, FIG. 1 shows a side view of an individual lead 10, which includes a terminal section 12 and a C-clip section 14. The leads 10 are preferably formed on a multi-stage progressive stamping machine (not shown) from a web of a resilient conductive material, such as phosphor bronze or beryllium copper. A desirable manufacturing process is described in further detail below with respect to FIG. 1A. In the embodiment shown, the terminal section 12 is connected to the C-clip 14 at the distal end 16 of the upper arm 18 of the C-clip 14. Alternatively, the terminal section 12 may be attached to the other end of the lead or to any exterior site on the C-clip 14, provided it does not physically interfere with the interior space of the C.

In the embodiment of FIG. 1, an electrical connection is to be formed between a substrate 20 and the upper arm 18 as shown in FIG. 2. Therefore, one interior surface of the C-clip 14 (illustratively shown as that of the upper arm 18) is provided with a mass of solder 22, making the lead 10 a solder-bearing lead. The solder may be attached to the lead in any known manner, such as shown in the present inventor's U.S. Pat. Nos. 4,592,617; 4,605,278; 4,679,889; 4,728,305; and 4,883,435.

FIG. 1A shows an intermediate stage of the fabrication of the leads. Formed between two carrier strips 44 are a plurality of lead bodies 10 spaced along the strips 44. Indexing apertures 50 are formed in the strips 44 for aid in moving the strips 44 and lead bodies 10 successively through the stages of a multi-stage progressive stamping machine. The pitch or spacing of the lead bodies 10 is made to correspond to the pitch or spacing of the conductive areas (e.g., pads) on the substrate with which the leads are intended to become associated.

Struck up from each lead body 10 are two pairs of tabs 24, 24', formed from two facing U-shaped cuts in the upper arm 18. Each pair of tabs 24 or 24' leaves a space therebetween, aligned with the corresponding spaces of successive bodies, thereby forming a channel extending between the tabs of the successive pairs. In one such channel (shown as the upper one in FIG. 1A) is laid a continuous wire 22' of solder. In a second channel shown as extending between tabs 24' (the lower set of tabs in FIG. 1A) is laid a continuous ribbon or band 28' of insulating material, such as teflon, having the cross-section described below.

After the solder and insulating material are laid between respective pairs of tabs 24, 24', the tabs are pressed (e.g., staked) into the respective bands to hold the solder and the insulating material to the respective bodies. Thereafter one of the carrier strips 44 may be severed and discarded, following which the lead bodies held by the remaining carrier strip 44 are formed into the shape shown in FIG. 1. The solder ribbon is severed on either side of the lead body at appropriate positions shown by the dotted lines 23, to leave a desired amount of solder secured to each lead body.

The lower arm 26 of each C-clip 14 is preferably electrically isolated from the associated substrate. In the embodiment shown in FIGS. 1 and 2, an extruded polymer insulating element or plug 28 is held on the lower arm 26 of the C-clip 14. The plug 28 is preferably an extruded band of teflon, although other non-conductive polymer materials will work similarly. The insulating element of plug 28 may be formed by severing the insulating filament 28' of FIG. 1A on either side of the lead body 10.

The cross-section of the insulating element 28, as seen in FIG. 1, has an enlarged bearing portion 30 facing the interior of the C and a smaller retention portion 32 held between the tabs 24' on the lower arm 26. Between the portions is a tapered neck region which allows the tabs 24' to close tightly on the plug 28 and prevents the plug 28 from rotating or escaping from the lower arm 26.

The bearing portion 30 preferably has rounded edges to accommodate the insertion of a substrate 20 into the C-opening without damaging the substrate's surface. The rounded leading edge 34 of the bearing portion 30 preferably diverges from the upper arm 18 to facilitate insertion of a substrate 20. The substrate 20 may be any electronic device, such as a PCB, an integrated circuit chip, or a chip carrier, that has exposed conductive areas 36 on a surface.

In operation, the edge 38 of the substrate 20 would be pressed between the distal end 16 of the upper arm 18 and the leading edge 34 of insulating plug 28. Due to the rounded leading edge 34 of the bearing segment 30, the two arms 18,26 will resiliently deflect away from each other, until the substrate 20 fits between the contact points of the upper and lower arms, i.e. the solder mass 22 and the plug 28, respectively.

Once inserted, the resilient force of the arms 18,26 against the upper and lower surfaces 40,42 of the substrate 20 will hold the substrate 20 in place with respect to the lead 10 during soldering, preventing any misalignment or short circuits during that operation. The solder mass 22 and in some cases the tabs 24 of the upper arm 18 used to hold the solder mass 22 will contact the conductive area 36 of the substrate 20. The bearing portion 30 of the plug 28 will contact the lower surface 42 of the substrate 20, but due to the insulating material of the plug 28, no electrical contact is made between the lad 10 and substrate surface.

The flat top surface of the plug bearing portion 30 provides a relatively large and stable area of contact between the lower arm 26 and the substrate 20 which assists in retaining the C-clip on the substrate during soldering. The plug 28 is preferably cut on either side of a lead 10, creating individual plugs 28. For other applications, the plug may be attached to a large number of leads 10 as a long band, which may be an extrusion, as shown in FIG. 1A. The lead bodies are preferably kept joined to a carrier strip until needed, when a section of the carrier strip carrying a desired number of leads may be severed from the main supply.

FIG. 2 shows, viewed from underneath, an assembly of two leads 10 inter-connected by a continuous insulating extruded filament 28' having the cross-section of plug 28, after the carrier strip has been removed. The filament 28' abuts one surface of the substrate 20, while the opposite surface contacts the solder masses 22 on the upper arms 18. The continuous insulating band 28' allows single connection of a set of the leads 10 to the substrate 20, useful before soldering, for testing the individual circuits of the substrate, without electrical interconnection of the leads 10, which would occur if they remained attached to a carrier strip. The leads are retained on the substrate 20 by the resilience of the C-clip, permitting testing of individual circuits. If there are improper connections, the leads 10 can be moved on the substrate 20 to a proper position before a soldered joint is formed. If the substrate 20 needs servicing as detected at the individual leads, it may be readily separated from the leads before soldering. If the connections are proper, heat is then applied to the lead/substrate assembly, melting the solder 22, which flows partially onto the conductive area 36. While the solder 22 is liquid, the resilient force of the two arms 18,26 against the substrate 20 will prevent undesirable movement of the substrate 20 with respect to the lead 10. After the solder 22 cools, an electrical connection is formed between the leads 10 and the conductive areas 36, and a mechanical bond between them is added to the resilient gripping force of the C-clip 14 to maintain the leads in position. It is also contemplated that a number of leads 10, still connected to a respective carrier strip may be attached to a substrate 20 having a large number of conductive areas 36. After soldering, the carrier strip would be removed from all of the leads 10 in one step.

Figure 5:
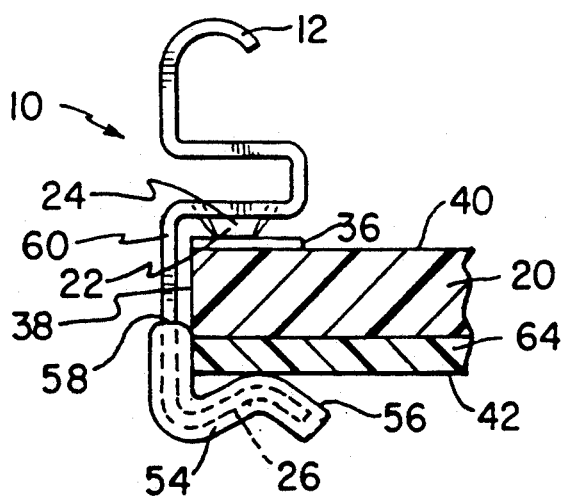
FIG. 5 is a side, cross-sectional view of a lead as in FIG. 4 engaged to a substrate.

After the leads 10 are securely attached to the substrate 20, the leads 10 may then be connected to any surrounding electric circuitry (not shown). This is accomplished in the preferred embodiment by connecting to the terminal 12. The terminal 12 may be formed in any shape of electrical terminal. In FIG. 5, the terminal is not shown, to signify that it is not a critical part of the invention. Various terminal configurations may be formed, including in the form of another lead 10 according to the present invention for connection to a conductive area 36 of another substrate 20.

Figure 3:
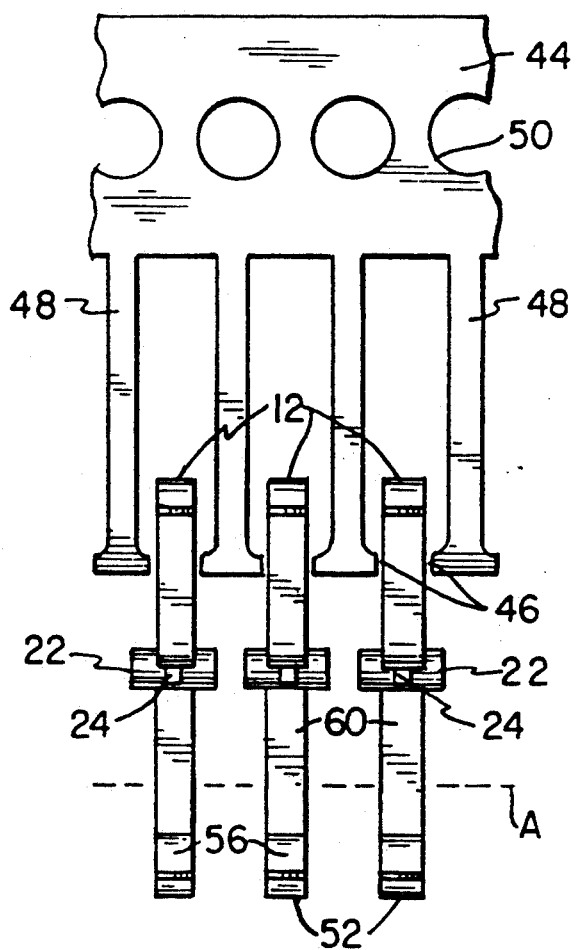
FIG. 3 is a fragmentary plan view of a strip of leads during manufacture according to another embodiment of the invention.
Figure 4:
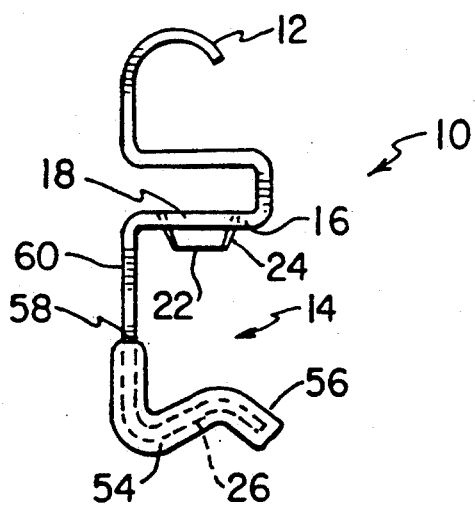
FIG. 4 is a side view of an individual lead shown in FIG. 3.

Referring now to FIG. 3, a front view of a strip of individual leads 10 (as shown in FIG. 4) is shown, which are connected to a carrier strip 44. The carrier strip 44 includes indexing holes 50 that are used by a stamping machine to move the strip successively to various stamping stations to form the strip 44 and leads 10 as shown. Individual leads 10 are connected by two break points 46 to retaining members 48 that are preferably integral with the carrier strip 44. The lead bodies are provided with solder masses 22 held by tabs 24 as in FIG. 1. The individual leads 10, once completed, can be later broken away from the members 48 at the break points 46.

The alternate embodiment shown in FIGS. 3 and 4, provides a further improvement for the leads 10. The lower arm 26 of each lead 10 is made non-conductive by coating the arm 26 with an insulating material. This is accomplished by passing the bottom edges 52 of the strip of leads 10 shown in FIG. 3 into a liquid polymer bath, approximately to the level denoted by dotted line A. This polymer is preferably an ultraviolet-cured epoxy, such as Loctite Impruv 363, although other like materials, such as latex or Teflon ®, can be used similarly. When the leads 10 are removed from the polymer bath, a polymer layer 54 is left coating the lower arm 26. Ultraviolet light is then immediately applied to the polymer layer 54, curing it within seconds. In choosing a coating material, it should be considered that the cured polymer should be durable enough to resist tearing when abutting a substrate. The speed with which the particular polymer cures is also a factor that will determine the overall manufacturing speed and cost of the leads 10.

The distal end 56 of the lower arm 26 is preferably divergent from the upper arm 18, as seen in FIG. 4, and has the advantages described above with respect to the embodiment of FIG. 1.

It will also be apparent that the proximal limit 58 of the non-conductive coating 54 may be advantageously extended to the base 60 of the C-clip 14. As shown in FIG. 5, if a substrate 20 is inserted too far into the C-clip 14, it will engage the non-conductive material at the proximal limit 58, preventing erroneous contact between the substrate 20 and bare metal of the C-clip 14 other than that abutting the conductive area 36. This is particularly important when the surface opposite the conductive pad 36 includes a metal layer 64, as shown in FIG. 5. Depending on the design of the substrate, the proximal limit 58 is then predetermined so that the portion of the base 60 overlying the metal layer 64 is covered with the insulating coating 54.

Figure 6:
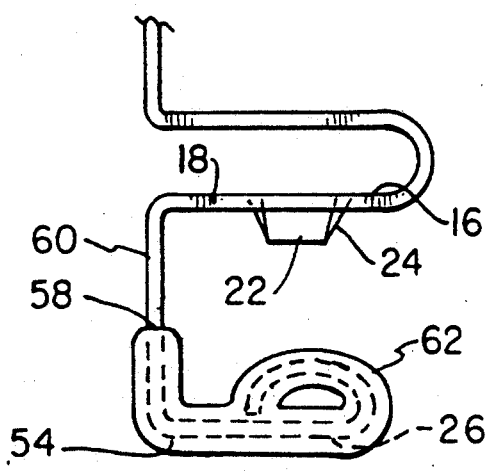
FIG. 6 is a side view of a lead according to an alternate embodiment of the invention.

In another alternate embodiment, a lead 10 is shown in FIG. 6 where the distal end 62 of the lower arm 26 is folded back onto itself to form a loop. This loop adds greater tolerance and resiliency to the C-clip 14, as the loop itself can deform slightly in response to pressure from insertion of a substrate 20. In this embodiment, as well as that shown in FIG. 4, the portion of the lower arm 26 at the mouth of the C-clip 14 is divergent, facilitating insertion of the substrate 20.

In either of the alternate embodiments, the insertion of the substrate 20 and possible adjustments of the substrate position, and then the subsequent soldering of the leads is carried out in a manner similar to the embodiment of FIGS. 1-2.

Thus, it is seen that after manufacture of a lead 10, a substrate 20 need only be pressed into the C-clip 14 and heated to attain an effective connection with one conductive area 36 on the substrate 20. The coating 54 on the lower arm 26 or the extruded plug 28 held on the arm 26 simply and reliably prevent electrical connection between the lower arm and substrate, while holding the leads 10 in proper relation to the substrate during assembly and thereafter until soldering is completed.

While the embodiments of the invention shown and described are capable of achieving the results desired, it is to be understood that these embodiments have been shown and described for purposes of illustration only and not for purposes of limitation, the scope of the invention being defined by the appended claims.

What is claimed is:

1. A conductive lead for connection to one conductive area of a device having a pair of opposed surfaces, comprising:
    an elongated conductive body formed from a substantially flat strip of resilient material and having a pair of opposed arms adapted to resiliently engage said opposed device surfaces;
    one of said arms carrying a conductive solder mass adapted to contact said conductive area on a respective one of the surfaces;
    a non-conductive element held by the other of the arms and adapted to engage the other one of the surfaces to insulate the lead from said surface, the non-conductive element having a narrowed neck area where said other arm engages the non-conductive element;
    whereby the other one of the surfaces is insulated by the lead and the non-conductive element from the conductive area on the respective one of the surfaces.

2. A substantially parallel array of conductive leads each according to claim 1, the non-conductive elements of the leads being portions of a single continuous elongated non-conductor which is adapted to support and fix the positions of the leads with respect to one another.

3. A lead for connection to a substrate having a pair of opposed surfaces, comprising:
    an elongated conductive body formed from a substantially flat strip of resilient material having a uniform width and having as portions thereof a first arm and a second arm, both of said arms being formed by bending said flat strip solely along axes transverse to the length of said strip, the arms being adapted to resiliently engage said substrate opposed surfaces;

a non-conductive coating covering said second arm, whereby electrical contact between said second arm and said substrate is prevented;

said coated second arm being adapted to directly engage its respective substrate surface along substantially the entire width of the strip;

wherein a distal end of the second arm diverges with respect to a distal end of the first arm, thereby facilitating insertion of the substrate therebetween, said distal end of said second arm having said non-conductive coating thereon; and wherein said distal end of the second arm is curved upon itself to form a loop.

4. A lead for connection to a substrate having a pair of opposed surfaces, comprising:

an elongated conductive body formed from a substantially flat strip of resilient material having a uniform width and having as portions thereof a first arm and a second arm, both of said arms being formed by bending said flat strip solely along axes transverse to the length of said strip, said second arm being angled toward said first arm to resiliently engage said substrate opposed surfaces between said arms;

a non-conductive coating covering said second arm, whereby electrical contact between said second arm and said substrate is prevented;

said coated second arm being adapted to directly engage its respective substrate surface along substantially the entire width of the strip.

5. A lead according to claim 4 wherein the first arm and second arm are integral and form a C-shaped clip.

6. A lead according to claim 5 wherein a distal end of the second arm diverges from a distal end of the first arm, thereby facilitating insertion of the substrate therebetween, said distal end having said non-conductive coating thereon.

7. A lead according to claim 4 wherein the first arm is solder-bearing.

8. A lead according to claim 4 wherein the first arm contacts the substrate at a conductive area.

9. A lead according to claim 4, wherein the first and second arms are formed from an elongated conductive body formed from a substantially flat strip of resilient conductive material.

10. An assemblage of leads, each as in claim 4, including a carrier strip, each lead being integral with said carrier strip and said leads being uniformly spaced along said carrier strip.

11. A lead for connection to a substrate having a pair of opposed surfaces, comprising:

an elongated conductive body formed from a substantially flat strip of resilient material having at least a portion with a uniform width and forming a pair of arms extending from a base portion, one of said arms being formed from said uniform width portion by bending solely along a transverse axis, the substrate being adapted to be resiliently retained between said arms such that said one arm directly engages said substrate along substantially the entire width of the strip, said one arm extending from said base portion at an acute angle toward the other of said arms; and a non-conductive coating on said one arm, preventing electrical contact between said substrate and said one arm.

12. A lead according to claim 11 wherein the other of the arms is solder-bearing.

13. A lead according to claim 11 wherein the first arm contacts the substrate at a conductive area.

14. An assemblage of leads, each as in claim 11, each lead being integral with a carrier strip and said leads being uniformly spaced along said carrier strip.

15. A lead according to claim 11 wherein the base and the arms are integral and form a C-shaped clip.

16. A lead according to claim 15 wherein a distal end of said one arm diverges from a distal end of the other of the arms, thereby facilitating insertion of the substrate therebetween said distal end having said non-conductive coating thereon.

17. A lead according to claim 16 wherein a distal end of the one arm is curved upon itself to form a loop.

18. A lead connection to a substrate having a pair of opposite surfaces, comprising:

a base;

a pair of arms extending from the base, the substrate being adapted to be resiliently retained between the arms; and a non-conductive coating on one of said arms, preventing electrical contact between said substrate and said one of said arms, said coating extending onto a portion of said base, preventing electrical contact between said substrate and said base.

19. A lead according to claim 18 wherein the surface of said substrate abutting said one arm is covered with a metallic layer.

20. A lead according to claim 19 wherein said portion of said base is not shorter than the thickness of said metallic layer.

21. A method of producing a lead for connection to a substrate having a pair of opposed surfaces, comprising the steps of:

forming a lead body from a substantially flat strip of resilient material having a portion with a uniform width such that said lead body has a first arm and a second arm, said arms being formed by bending said flat strip solely along transverse axes, said second arm being angled toward said first arm such that said arms are adapted to resiliently hold a substrate therebetween, said second arm being adapted to directly engage one of said opposed substrate surfaces along substantially the entire width of the strip; and coating said second arm with a non-conductive material whereby electrical contact between said second arm and said substrate is prevented.

22. A method according to claim 21 wherein the first and second arms are integral, form a C-shaped clip, and are formed of a resilient conductive material.

23. A method as in claim 21, further comprising the step of:

assembling said lead to said substrate between said first arm and said second arm.

24. A method according to claim 21 wherein the step of coating further comprises:

submerging the second arm in a liquid polymer;

removing the second arm from the polymer with a layer of polymer covering the second arm; and hardening the polymer to form a solid coating.

25. A method according to claim 24 wherein hardening comprises providing ultraviolet energy to the liquid polymer coating.